(12) United States Patent
Egelhof et al.

(10) Patent No.: US 11,762,036 B2
(45) Date of Patent: Sep. 19, 2023

(54) CONTROL DEVICE FOR A VEHICLE

(71) Applicant: Eberspächer Controls Landau GmbH & Co. KG, Landau (DE)

(72) Inventors: André Egelhof, Hochspeyer (DE); Kenneth Midtgaard Pedersen, Kuppenheim (DE)

(73) Assignee: Eberspächer Controls Landau GmbH & Co. KG, Landau (DE)

( * ) Notice: Subject to any disclaimer, the term of this patent is extended or adjusted under 35 U.S.C. 154(b) by 368 days.

(21) Appl. No.: 17/036,272

(22) Filed: Sep. 29, 2020

(65) Prior Publication Data
US 2021/0103005 A1 Apr. 8, 2021

(30) Foreign Application Priority Data
Oct. 8, 2019 (DE) .................... 10 2019 126 953.9

(51) Int. Cl.
*G01R 31/52* (2020.01)
*G07C 5/08* (2006.01)

(52) U.S. Cl.
CPC .............. *G01R 31/52* (2020.01); *G07C 5/08* (2013.01)

(58) Field of Classification Search
CPC .......... G01R 31/52; G01R 31/54; G07C 5/08; B60R 16/03
See application file for complete search history.

(56) References Cited

U.S. PATENT DOCUMENTS

| | | | |
|---|---|---|---|
| 10,882,475 B2* | 1/2021 | Kaußler | H02H 3/202 |
| 11,131,720 B2* | 9/2021 | Araki | G01R 31/364 |
| 2009/0128106 A1* | 5/2009 | Takahashi | G05F 1/575 |
| | | | 323/277 |
| 2017/0234918 A1* | 8/2017 | Tsuchiya | G01R 31/006 |
| | | | 324/503 |
| 2019/0353715 A1* | 11/2019 | Miki | H02M 1/32 |
| 2022/0209524 A1* | 6/2022 | Belling | H02H 3/32 |

FOREIGN PATENT DOCUMENTS

| | | |
|---|---|---|
| DE | 112016002693 T5 | 3/2018 |
| DE | 102017109530 A1 | 11/2018 |
| WO | 2017008057 A1 | 1/2017 |

\* cited by examiner

*Primary Examiner* — Jelani A Smith
*Assistant Examiner* — Alyssa Rorie
(74) *Attorney, Agent, or Firm* — McGlew and Tuttle, P.C.

(57) ABSTRACT

A vehicle control device includes a potential terminal (14), a ground output (22) and a processing unit (12) with a potential input (20). A ground loss detection device (27) includes a first ground loss detection line area (24) connecting the ground output to a first ground potential terminal (28) and a second ground loss detection line area (26) connecting the ground output to a second ground potential terminal (30). An operating voltage generation unit generates a predefined operating voltage between the potential input and the ground output based on a supply voltage present at the potential terminal. A first voltage detection device detects a voltage between the potential input and the first ground potential terminal. A second voltage detection device detects a voltage between the potential input and the second ground potential terminal. A third voltage detection device detects a voltage between the potential input and the ground output.

16 Claims, 1 Drawing Sheet

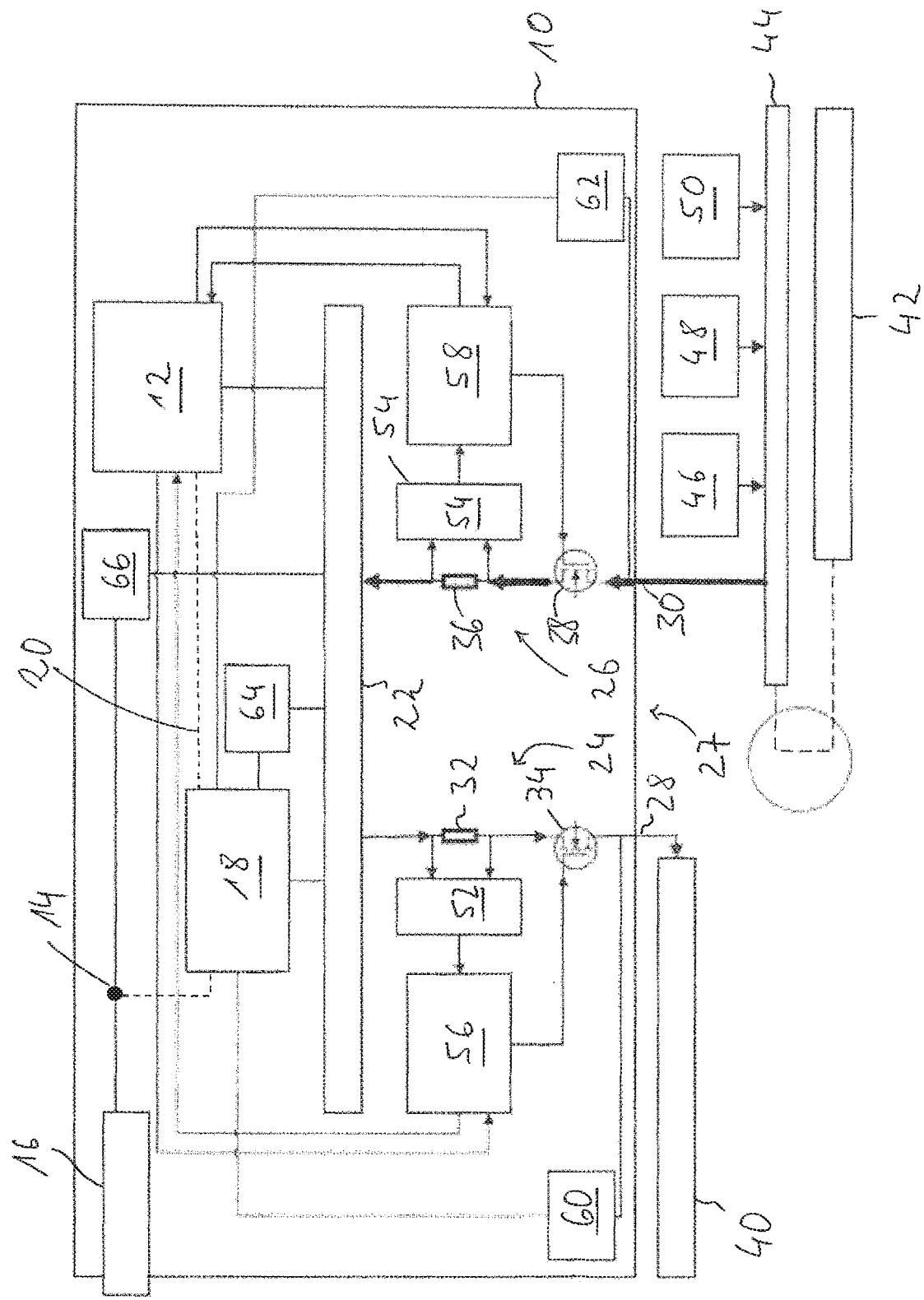

CONTROL DEVICE FOR A VEHICLE

CROSS REFERENCE TO RELATED APPLICATIONS

This application claims the benefit of priority under 35 U.S.C. § 119 of German Application 10 2019 126 953.9, filed Oct. 8, 2019, the entire contents of which are incorporated herein by reference.

TECHNICAL FIELD

The present invention pertains to a control device for a vehicle, comprising a potential terminal that is connected or is to be connected to a voltage source, a ground output and a processing unit with a potential input, wherein a ground loss detection device is provided in association with the ground output, wherein the ground loss detection device comprises a first ground loss detection line area for connecting the ground output to a first ground potential terminal to be connected to a first vehicle ground terminal of a vehicle and a second ground loss detection line area for connecting the ground output to a second ground potential terminal to be connected to a second vehicle ground terminal of a vehicle.

TECHNICAL BACKGROUND

Such a control device is known from DE 10 2017 109 530 A1. In this prior-art control device, each of the two ground loss detection line areas comprises a metal oxide semiconductor field effect transistor (MOSFET) and, associated with this, a ground loss detection transistor. When a ground loss occurs between a respective ground loss detection line area and a vehicle ground terminal connected thereto, the switching state of the ground loss detection transistor associated with this ground loss detection line area and hence also the switching state of the MOSFET change, so that this is brought into a nonconductive state when a ground loss occurs.

SUMMARY

An object of the present invention is to provide a control device for a vehicle, which control device has, in a simple configuration, an improved suitability for use in a safety-relevant environment.

This object is accomplished according to the present invention by a control device for a vehicle, comprising a potential terminal connected or to be connected to a voltage source, a ground output and a processing unit with a potential input, wherein a ground loss detection device is provided in association with the ground output, wherein the ground loss detection device comprises a first ground loss detection line area for connecting the ground output to a first ground potential terminal to be connected to a first vehicle ground terminal of a vehicle and a second ground loss detection line area for connecting the ground output to a second ground potential terminal to be connected to a second vehicle ground terminal of a vehicle.

This control device is further characterized by an operating voltage generation unit for generating a predefined operating voltage between the potential input of the processing unit and the ground output based on a supply voltage present at the potential terminal, and by a first voltage detection device for detecting a voltage between the potential input and the first ground potential terminal, a second voltage detection device for detecting a voltage between the potential input and the second ground potential terminal, and a third voltage detection device for detecting a voltage between the potential input and the ground output.

A voltage drop, which leads to a shift of the potential that is present at the ground output in relation to a ground potential provided by the vehicle ground terminals occurs in the area of the ground loss detection line areas located between the ground output and the vehicle ground terminals of a vehicle and of the electrical components arranged therein. It becomes possible, due to the configuration of a control device according to the present invention, to determine this voltage drop, i.e., the voltage between the ground output and a respective ground potential terminal, in each of the ground loss detection line areas and to use the voltage drop determined for each ground loss detection line area, i.e., the potential difference between the ground output and the respective ground potential terminal, for an increased precision in the determination of the voltage of the onboard power supply system in a vehicle. Such a high precision in the determination of the voltage in the onboard power supply system is necessary especially in environments such as vehicles equipped for self-driving in order to make it possible to meet the high safety requirements imposed in the case of such systems.

In order to make it possible to provide the information on the voltage drop occurring in a particular ground loss detection line area in a reliable manner, it is proposed that a first voltage signal representing the voltage detected by the first voltage detection device, a second voltage signal representing the voltage detected by the second voltage detection device and a third voltage signal representing the voltage detected by the third voltage detection device be fed to the processing unit, and that the processing unit be configured to determine a voltage drop in the first ground loss detection line area on the basis of the first voltage signal and of the third voltage signal and to determine a voltage drop in the second ground loss detection line area on the basis of the second voltage signal and of the third voltage signal.

To provide very precise information on the voltage of the onboard power supply system that is available in an onboard power supply system in a vehicle, a fourth voltage detection device may be provided for detecting a voltage between the potential terminal and the ground output, wherein the processing unit is configured to determine a voltage between the potential terminal and a ground potential of a vehicle on the basis of the voltage detected by the fourth voltage detection device and of the voltage drop in the first ground loss detection line area or/and of the voltage drop in the second ground loss detection line area.

According to another, especially advantageous aspect of the present invention, which aspect cannot, however, necessarily be combined with the aspects explained above, the first ground loss detection line area may comprise a series connection of a first ground loss detection resistor and a first MOSFET. The second ground loss detection line area may comprise a series connection of a second ground loss detection resistor and a second MOSFET. A very simply structured and reliably acting configuration, which makes it possible to detect with simple means whether a ground loss is present or an interruption has occurred, which makes it possibly necessary to take safety measures, is thus provided in a particular ground loss detection line area.

A current detection device may be associated with each ground loss detection resistor of the first ground loss detection resistor and the second ground loss detection resistor for detecting an electrical current flowing over these resistors. An analysis/actuating unit may be associated with the current detection device for analyzing the electrical current detected by the current detection device and for actuating the MOSFET connected in series with the respective ground loss detection resistor on the basis of the electrical current detected by the current detection device.

It is proposed for a reliable detection of a ground loss that the analysis/actuating unit associated with a respective ground loss detection resistor be configured to apply an actuating signal to the MOSFET connected in series to the ground loss detection resistor for switching the MOSFET into its conductive state when the current detected by the associated current detection device indicates a current flow from the ground output to the respective associated ground potential terminal from the first ground potential terminal and from the second ground potential terminal, and not to apply any actuating signal to the MOSFET connected in series to the ground loss detection resistor for switching the MOSFET into its conductive state when the current detected by the associated current detection device indicates a current flow from the respective associated ground potential terminal from the first ground potential terminal and from the second ground potential terminal to the ground output or it does not indicate any current flow between the ground output and the respective associated ground potential terminal from the first ground potential terminal and from the second ground potential terminal to the ground output, to which the MOSFET is connected in series to the ground loss detection resistor. Consequently, a ground loss can be detected in such a structure from the direction in which a current flow is present and based on whether a current flow is present at all. A current flow from the ground output to a respective ground potential terminal indicates a correct current flow occurring during normal operation, while the absence of such a current flow or a current flow in the opposite direction indicates that an interruption to a respective vehicle ground terminal has occurred or a backflow is present, which is triggered by at least one additional control device connected by its ground output to a respective ground potential terminal of the control device.

In order to make it possible to provide information on a ground loss that has occurred and on a correct connection to a respective vehicle ground terminal for further processing, it is proposed that the analysis/actuating unit associated with a respective ground loss detection resistor be configured to feed to the processing unit a ground signal indicating the current flow over the respective associated ground loss detection resistor or/and the switching state of the respective associated MOSFET.

A short-term reversal of the current flow or a brief absence of the current flow may occur even in case a connection is present correctly at a vehicle ground terminal in a ground loss detection line area if, for example, potential shifts occur briefly due to the connection or disconnection of batteries or electrical energy consumers. According to another advantageous aspect, it is proposed therefore to actuate the analysis/actuating unit assigned to a respective ground loss detection resistor for applying an actuating signal to the respective associated MOSFET when the ground signal fed to the processing unit by the analysis/actuating unit indicates a ground loss to the vehicle ground terminal connected or to be connected to a respective associated ground potential terminal. It can be checked in this manner whether a physical interruption has indeed occurred, which causes a current flow not to occur or not to occur in the direction to be expected even after the attempt at switching the MOSFET into the conductive state again. If the interruption of the current flow was only temporary, a normal operation with a current flow from the ground output via both ground loss detection line areas can be established again by switching the MOSFET into its conductive state after ending the potential shift that occurred temporarily in a vehicle.

In order to make it possible, for example, to take safety measures by means of a higher-level control device when a ground loss was detected, it is further proposed that the processing unit be configured to generate a malfunction signal when at least one ground signal fed to the processing unit indicates a ground loss to the vehicle ground terminal connected or to be connected to a respective ground potential terminal.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the drawings:

FIG. 1 is a schematic view of a control device for a vehicle.

DESCRIPTION OF PREFERRED
EMBODIMENTS

Referring to the drawings, a control device, which meets the high safety requirements imposed in vehicles for self-driving, is designated by 10 in FIG. 1. The control device 10 comprises as a central area a processing unit generally designated by 12. The processing unit 12 may comprise one or more microprocessors, which are provided with corresponding work programs in order to execute the control functions intended for the control device. The control device 10 is connected in the area of a potential terminal 14 to an onboard power supply system generally designated by 16, which provides, for example, a voltage in the range of 12 V relative to a ground potential of a vehicle. Based on this vehicle system voltage present in the onboard power supply system 16, an operating voltage generation unit 18 generates an operating voltage at a potential input 20 of the processing unit 12 or generally of the control device 10. This operating voltage may be, for example, in the range of 3.3 V relative to a ground output 22 of the control device 10.

The ground output 22 of the control device 10 is connected via two ground loss detection line areas 24, 26 of a ground loss detection device 27, which are arranged in parallel, to respective ground potential terminals 28, 30 of the control device 10. The first ground loss detection line area 24 comprises a first ground loss detection resistor 32 configured, for example, as a shunt resistor, and, after this or in series with this, a first MOSFET 34. The first MOSFET 34 may be, for example, an n-channel power MOSFET, whose source terminal is connected to the first ground loss detection resistor 32 and whose drain terminal is connected to the first ground potential terminal 28. The second ground loss detection line area 26 likewise comprises a second ground loss detection resistor 36, which is configured, for example, as a shunt resistor, and, after this, a second MOSFET, which may, in turn, be configured as an n-channel power MOSFET and is connected with via a source terminal of the MOSFET to the second ground loss detection resistor 36 and is connected with a drain terminal of the MOSFET to the second ground potential terminal 30 of the control device 10.

To establish a closed circuit, each of the two ground potential terminals 28, 30 is connected to a vehicle ground terminal 40, 42, and the two vehicle ground terminals 40, 42 are physically separated from one another and are each at the ground potential of the vehicle. For example, a bus bar 44 may be connected together with the second ground potential terminal 30 to the second vehicle ground terminal 42. Additional control devices 46, 48, 50 may be connected via this bus bar 44 to the second vehicle ground terminal 42.

In the normal operation, the electrical current flowing over the processing unit 12 flows over the ground output 22 and the two ground loss detection line areas 24, 26 to the vehicle ground terminals 40, 42 connected to the two ground potential terminals 28, 30. In order to detect this correct functionality and to detect that a ground loss has occurred in the area of the connection to one of the vehicle ground terminals 40, 42, i.e., that a physical interruption of the line has occurred, a current detection device 52, 54 is associated with each ground loss detection resistor 32, 36. The current detection devices 52, 54 supply a signal, which indicates the electrical current flowing over the respective associated ground loss detection terminal 28, 30, especially the direction of flow of the current, to a respective analysis/actuating unit 56, 58. The analysis/actuating units 56, 58 may likewise be configured, for example, with a programmed microprocessor in order to carry out an analysis/actuation procedure in this manner. Based on the faster response time, the analysis/actuating units are, however, preferably configured as analog circuits.

Depending on the current signal supplied by a respective associated current detection device 52, 54, each analysis/actuating unit 56, 58 supplies a ground signal to the processing unit 12. The ground signal may be, for example, a digital signal with two voltage levels, wherein a high voltage level may indicate a correct functionality and a correct current flow, especially a current flow from the ground output 22 to the respective associated ground potential terminal 28 or 30, while a signal with a low level, for example, also with a voltage level zero, i.e., a voltage-free state, indicates that there is no current flow or there is a current flow in the reverse direction, i.e., from the respective ground potential terminal 28, 30 to the ground output 22.

At the same time, each of the analysis/actuating units provides an actuating signal for the respective associated MOSFET 34 and 38. This actuating signal is applied to the gate terminal of the MOSFET 34, 38 and is generated, for example, when the signal supplied by the respective associated current detection device 52, 54 indicates a correct current flow and a voltage signal with a high level is thus also outputted to the processing unit 12. If the current signal supplied by the respective associated current detection device 52, 54 indicates that there is no current flow or there is a current flow in the incorrect direction, no actuating signal is applied at the gate terminal of the respective associated MOSFET 34, 38, so that this is not switched into its conductive state, but it remains in its nonconductive state. Based on the intrinsic diode present in each such MOSFET, this aspect of the MOSFET blocks, in this nonconductive state, the current flow from the ground potential terminal 28, 30 to the ground output 22, while a current flow from the ground output 22 to the ground potential terminal 28 and 30, respectively, would, in principle, be possible, so that a current flow from the ground output 22 to the two ground potential terminals 28, 30 is possible, in principle, especially also at the beginning of the operation, i.e., in a state in which no actuating signal is outputted as yet for switching the associated MOSFET 34, 38 into its conductive state due to a lack of current detection by the respective analysis/actuating unit 56, 58.

If a ground loss occurs in the area of one of the vehicle ground terminals 40, 41, which is shown in this example in association with the second vehicle ground terminal, a current flow is no longer possible from the ground output 22 of the control device 10 to the respective affected ground potential terminal, here the ground potential terminal 30. If, however, additional control devices are still connected to this ground potential terminal 30, for example, via the bus bar 44, the connection to the vehicle ground terminal 42 is lost for these as well. The current flowing over these control devices 46, 48, 50 would therefore flow in the reverse direction via the second ground loss detection line area 26, the ground output 22 and the first ground loss detection line area 24 to the first vehicle ground terminal 40. In order to prevent such a current flow, which also compromises the functionality of the control device 10, the analysis/actuating unit 58 associated with the second ground loss detection line area 26 ends the outputting of the actuating signal to the gate terminal of the second MOSFET 38 and thus switches this into its nonconductive state in this state, in which the current detection device 52 still detects, in association with the first ground loss detection line area 24, a correct current flow, i.e., the current flowing in the correct direction, but the current detection device 54 detects in the second ground loss detection line area 26 a current flow in the incorrect direction. A current flow from the bus bar 44 over the second ground loss detection line area 26 to the vehicle ground terminal 40 is thus prevented. Through the signal with low level, which is fed to the processing unit 12, and by ending the application of a signal with a high level to the processing unit 12, the analysis/actuating unit 58 supplies at the same time information that a ground loss has occurred in the area of the second ground loss detection in area 26 and of the second ground potential terminal 30.

The ending of a current flow over a respective ground loss detection line area 24, 26 and the reversal of the current flow may also occur briefly when, for example, batteries are connected or disconnected in an onboard power supply system of a vehicle or electrical energy consumers are connected or disconnected. In order to guarantee that measures, which are to be taken when a physical ground loss has indeed occurred, are not incorrectly taken, the actuating unit 12 can output, after the detection of such an ending of the current flow or of the reversal of the current flow direction, in association with the respective affected ground loss detection line area 24 and 26 or the analysis/actuating unit associated with this, in this case the analysis/actuating unit 58, such an actuating signal that this outputs to the associated MOSFET, in the case to the second MOSFET 38, an actuating signal for switching this MOSFET into its conductive state. If this causes a current flow in the correct direction to be detected again, the system can resume or continue its normal operation, because the temporary interruption of the current flow or reversal of the current flow direction was very likely to be able to be attributed in this case to potential fluctuations in the onboard power supply system 16. If it fails to lead to the desired result when carried out first, this process may, for example, also be repeated several times in order to make sure whether a defect that cannot be eliminated by this measure, i.e., a physical ground loss, has indeed occurred. If this is the case, the processing unit 12 can generate a malfunction signal and feed it to a higher-level actuating unit, so that additional safety measures can then be taken in a vehicle; for example, one more trip to the next destination is still allowed and the necessary checking and repair actions are then initiated. Provisions may also be made, even in the case of an only temporary interruption of the current flow or a reversal of the current flow, especially if this occurs repeatedly, but the correct functionality of the ground loss detection line area 26 was able to be restored by the above-described measure, for generating a malfunction signal in order to make it possible, for example, at the time of the next inspection of a vehicle, to investigate the possible cause of such potential fluctuations, which occurred, for example, in an unexpectedly high number.

It becomes possible in a simple and reliable manner with the above-described configuration and its functionality to detect the occurrence of a ground loss and to respond quickly by interrupting the line connection in a respective ground loss detection line area 24, 26. Since the probability that such a ground loss occurs at the same time in association with both vehicle ground terminals 40, 42 is comparatively low, very high operational safety is guaranteed by the redundant connection of the control device 10 to the ground potential of the vehicle, and the operational safety could even be increased by providing more than two such ground loss detection line areas with the above-described functionality.

The electrical components present in a respective ground loss detection line area 24, 26, i.e., the two ground loss detection resistors 32, 36 and the two MOSFETs 34, 38, cause a voltage drop to occur in each of these two ground loss detection line areas 24, 26. This voltage drop may be in a range below 50 mV in case of an operating current of, for example, 250 mA. The consequence of this voltage drop is that the ground output 22 of the control device 10 is at a potential above the ground potential of the vehicle, which is present at the two vehicle ground terminals 40, 42. In order to make it possible to determine this voltage drop in a simple and reliable manner and to use it in the manner described below, a first voltage detection device 60 is associated with the first ground loss detection line area 24. The first voltage detection device 60 detects the voltage, i.e., the voltage drop or the potential difference between the potential input 20 of the processing unit 12 and of the control device 10 and the first ground potential terminal 28. A second voltage detection device, which detects the voltage, i.e., the voltage drop or the potential difference, between the potential input 20 of the processing device 12 or of the control device 10 and the second ground potential terminal 30, is likewise associated with the second ground loss detection line area 26. A third voltage detection device detects the voltage, i.e., the voltage drop or the potential difference between the potential input 20 of the processing unit 12 or of the control device 10 and the ground output 22. The voltage detected by the third voltage detection device 64 corresponds essentially to the operating voltage, which is generated by the operating voltage generation unit and is present between the potential input 20 of the processing unit 12 or the control device 10 and the ground output 22 and which may be, for example, in the range of 3.3 V, as was described. Based on a first voltage signal, which is generated by the first voltage detection device 60 and which represents the voltage between the potential input 20 and the first ground potential terminal 28, and on a third voltage signal, which is outputted by the third voltage detection device and which represents the voltage between the potential input 20 and the ground output 22, the voltage drop between the potential output 22 and the first ground potential terminal 28 can be determined. This voltage drop occurring in the first ground loss detection line area 24 corresponds essentially to a difference between the voltage represented by the first voltage signal and the voltage represented by the third voltage signal. In association with the second ground loss detection line area 26, the voltage drop occurring there can be determined on the basis of a second voltage signal, which is supplied by the second voltage detection device 62 and which represents the voltage drop between the potential input 20 and the second ground potential terminal 30, and the third voltage signal, and the voltage drop between the ground output 22 and the second ground potential terminal 30 corresponds essentially to the difference between the voltage signal supplied by the second voltage detection device 62 and the voltage signal supplied by the third voltage detection device 64 here as well.

In association with the control device 10, a fourth voltage detection device 66 may be provided, which is used to detect the voltage, i.e., the voltage drop or the potential difference between the potential terminal 14 of the control device 10, i.e., essentially the onboard power supply system 16, and the ground terminal 22. A fourth voltage signal, which can be further processed in the control device 10 or in other system areas of a vehicle as the vehicle system voltage, can be supplied in this manner by the control device 10 or by the fourth voltage detection device 66. Since, as was described above, this fourth voltage signal does not, however, exactly reflect the vehicle system voltage actually present in the vehicle in terms of the ground potential, i.e., for example, of the vehicle ground terminals 40, 42 based on the voltage drop occurring in the two ground loss detection line areas 24, 26, the voltage detected by the fourth voltage detection device 66 can be corrected by the determination of this voltage drop in the above-described manner, taking into consideration this respective voltage drop detected for the two ground loss detection line areas 24, 26. The vehicle system voltage present in a vehicle can be provided with high precision in this manner. Further, the information on the voltage drop occurring in a respective ground loss detection line area can be used as a redundant diagnostic signal for the detection of a ground loss. When a ground loss occurs in one of the ground loss detection line areas 24, 26, the entire operating current of the control device 10 will then flow over the other ground loss detection line area, so that the voltage drop occurring in this will also double corresponding to the doubling of the current flow. In conjunction with the signal of the signals fed by an analysis/actuating unit associated with the ground loss detection line area affected by a ground loss, which signal is fed to the processing unit 12, this information on the voltage drop occurring in a ground loss detection line area can then be used for an even more reliable detection of a ground loss.

While specific embodiments of the invention have been shown and described in detail to illustrate the application of the principles of the invention, it will be understood that the invention may be embodied otherwise without departing from such principles.

What is claimed is:

1. A control device for a vehicle, the control device comprising:
   a potential terminal connected or to be connected to a voltage source;

a ground output;
a processing unit with a potential input, the processing unit being configured for carrying out vehicle control operations;
a ground loss detection device associated with the ground output, the ground loss detection device comprising:
  a first ground loss detection line area connecting the ground output to a first ground potential terminal to be connected to a first vehicle ground terminal of the vehicle; and
  a second ground loss detection line area connecting the ground output to a second ground potential terminal to be connected to a second vehicle ground terminal of the vehicle;
an operating voltage generation unit configured to generate a predefined processing unit operating voltage between the potential input of the processing unit and the ground output based on a supply voltage present at the potential terminal, the operating voltage generation unit applying the processing unit operating voltage to the potential input of the processing unit;
a first voltage detection device configured to detect a voltage between the potential input and the first ground potential terminal, a first voltage signal representing the voltage detected by the first voltage detection device being fed to the processing unit;
a second voltage detection device configured to detect a voltage between the potential input and the second ground potential terminal, a second voltage signal representing the voltage detected by the second voltage detection device being fed to the processing unit;
a third voltage detection device configured to detect a voltage between the potential input and the ground output, a third voltage signal representing the voltage detected by the third voltage detection device being fed to the processing unit;
a fourth voltage detection device for detecting a voltage between the potential terminal and the ground output, a fourth voltage signal representing the voltage detected by the fourth voltage detection device being fed to the processing unit, the processing unit being further configured to:
  determine a voltage drop in the first ground loss detection line area on the basis of the first voltage signal and the third voltage signal;
  determine a voltage drop in the second ground loss detection line area on the basis of the second voltage signal and the third voltage signal;
  determine a voltage between the potential terminal and a ground potential of the vehicle on the basis of the fourth voltage signal and the voltage drop in the first ground loss detection line area; and
  determine the voltage between the potential terminal and the ground potential of the vehicle on the basis of the fourth voltage signal and the voltage drop in the second ground loss detection line area.

2. The control device in accordance with claim 1, wherein:
  the first ground loss detection line area comprises a series connection of a ground loss detection resistor and a MOSFET; or
  the second ground loss detection line area comprises a series connection of a ground loss detection resistor and a MOSFET; or
  the first ground loss detection line area comprises a series connection of a first ground loss detection resistor and a first MOSFET and the second ground loss detection line area comprises a series connection of a second ground loss detection resistor and a second MOSFET.

3. The control device in accordance with claim 2, wherein:
  a current detection device is associated with each of the first ground loss detection resistor and the second ground loss detection resistor for detecting an electrical current flowing therethrough; and
  an analysis/actuating unit is associated with the current detection device for analyzing the electrical current detected by the current detection device and for actuating the MOSFET connected in series with the respective ground loss detection resistor based on the electrical current detected by the current detection device.

4. The control device in accordance with claim 3, wherein the analysis/actuating unit associated with the respective ground loss detection resistor is configured to apply an actuating signal to the MOSFET connected in series with the ground loss detection resistor for switching the MOSFET into a conductive state when the current detected by the associated current detection device indicates a current flow from the ground output to the respective associated ground potential terminal from the first ground potential terminal and from the second ground potential terminal and to not apply the actuating signal for switching the MOSFET into the conductive state to the MOSFET connected in series with the ground loss detection resistor when the current detected by the associated current detection device indicates a current flow from the respective associated ground potential terminal from the first ground potential terminal and from the second ground potential terminal to the ground output or the associated current detection device indicates no current flow between the ground output and the respective associated ground potential terminal from the first ground potential terminal and from the second ground potential terminal to the ground output.

5. The control device in accordance with claim 4, wherein the analysis/actuating unit associated with a respective one of the ground loss detection resistors is configured to feed to the processing unit a ground signal indicating current flow through the respective associated ground loss detection resistor or/and the switching state of the respective associated MOSFET.

6. The control device in accordance with claim 5, wherein the processing unit is configured to actuate the analysis/actuating unit associated with a respective ground loss detection resistor for applying the actuating signal to the respective associated MOSFET when the ground signal fed to the processing unit by the analysis/actuating unit indicates a ground loss to the vehicle ground terminal connected or to be connected to a respective associated ground potential terminal.

7. The control device in accordance with claim 5, wherein the processing unit is configured to generate a malfunction signal when at least one ground signal fed to the processing unit indicates a ground loss to the vehicle ground terminal connected or to be connected to a respective ground potential terminal.

8. The control device in accordance with claim 6, wherein the processing unit is configured to generate a malfunction signal when at least one ground signal fed to the processing unit indicates the ground loss to the vehicle ground terminal connected or to be connected to a respective ground potential terminal.

9. A control device for a vehicle, the control device comprising:
- a potential terminal connected or to be connected to a voltage source;
- a ground output;
- a processing unit with a potential input;
- a ground loss detection device associated with the ground output, the ground loss detection device comprising:
  - a first ground loss detection line area connecting the ground output to a first ground potential terminal to be connected to a first vehicle ground terminal of the vehicle; and
  - a second ground loss detection line area connecting the ground output to a second ground potential terminal to be connected to a second vehicle ground terminal of the vehicle;
- an operating voltage generation unit configured to generate a predefined processing unit operating voltage between the potential input of the processing unit and the ground output based on a supply voltage present at the potential terminal, the operating voltage generation unit being further configured to apply the processing unit operating voltage to the potential input of the processing unit, wherein the processing unit is configured for carrying out vehicle control operations via the operating voltage;
- a first voltage detection device configured to detect a voltage between the potential input and the first ground potential terminal, the first voltage detection device being further configured to generate a first voltage signal as output, the first voltage signal comprising the voltage detected by the first voltage detection device, the processing unit being further configured to receive the first voltage signal as input;
- a second voltage detection device configured to detect a voltage between the potential input and the second ground potential terminal, the second voltage detection device being further configured to generate a second voltage signal as output, the second voltage signal comprising the voltage detected by the second voltage detection device, the processing unit being further configured to receive the second voltage detection device as input;
- a third voltage detection device configured to detect a voltage between the potential input and the ground output, the third voltage detection device being further configured to generate a third voltage signal as output, the third voltage signal comprising the voltage detected by the third voltage detection device, the processing unit being further configured to receive the third voltage signal as input;
- a fourth voltage detection device configured to detect a voltage between the potential terminal and the ground output, the fourth voltage detection device being further configure to generate a fourth voltage signal as output, the fourth voltage signal comprising the voltage detected by the fourth voltage detection device, the processing unit being further configured to receive the fourth voltage signal as input, wherein the processing unit is further configured to:
  - determine a voltage drop in the first ground loss detection line area based on the first voltage signal and the third voltage signal;
  - determine a voltage drop in the second ground loss detection line area based on the second voltage signal and the third voltage signal;
  - determine a voltage between the potential terminal and a ground potential of the vehicle based on the fourth voltage signal and the voltage drop in the first ground loss detection line area; and
  - determine the voltage between the potential terminal and the ground potential of the vehicle based on the fourth voltage signal and the voltage drop in the second ground loss detection line area.

10. The control device in accordance with claim 9, wherein:
- the first ground loss detection line area comprises a series connection of a ground loss detection resistor and a MOSFET; or
- the second ground loss detection line area comprises a series connection of a ground loss detection resistor and a MOSFET; or
- the first ground loss detection line area comprises a series connection of a first ground loss detection resistor and a first MOSFET and the second ground loss detection line area comprises a series connection of a second ground loss detection resistor and a second MOSFET.

11. The control device in accordance with claim 10, wherein:
- a current detection device is associated with each of the first ground loss detection resistor and the second ground loss detection resistor for detecting an electrical current flowing therethrough; and
- an analysis/actuating unit is associated with the current detection device for analyzing the electrical current detected by the current detection device and for actuating the MOSFET connected in series with the respective ground loss detection resistor based on the electrical current detected by the current detection device.

12. The control device in accordance with claim 11, wherein the analysis/actuating unit associated with the respective ground loss detection resistor is configured to apply an actuating signal to the MOSFET connected in series with the ground loss detection resistor for switching the MOSFET into a conductive state when the current detected by the associated current detection device indicates a current flow from the ground output to the respective associated ground potential terminal from the first ground potential terminal and from the second ground potential terminal and to not apply the actuating signal for switching the MOSFET into the conductive state to the MOSFET connected in series with the ground loss detection resistor when the current detected by the associated current detection device indicates a current flow from the respective associated ground potential terminal from the first ground potential terminal and from the second ground potential terminal to the ground output or the associated current detection device indicates no current flow between the ground output and the respective associated ground potential terminal from the first ground potential terminal and from the second ground potential terminal to the ground output.

13. The control device in accordance with claim 12, wherein the analysis/actuating unit associated with a respective one of the ground loss detection resistors is configured to feed to the processing unit a ground signal indicating current flow through the respective associated ground loss detection resistor or/and the switching state of the respective associated MOSFET.

14. The control device in accordance with claim 13, wherein the processing unit is further configured to actuate the analysis/actuating unit associated with a respective ground loss detection resistor for applying the actuating signal to the respective associated MOSFET when the ground signal fed to the processing unit by the analysis/actuating unit indicates a ground loss to the vehicle ground terminal connected or to be connected to a respective associated ground potential terminal.

15. The control device in accordance with claim 13, wherein the processing unit is further configured to generate a malfunction signal when at least one ground signal fed to the processing unit indicates a ground loss to the vehicle ground terminal connected or to be connected to a respective ground potential terminal.

16. The control device in accordance with claim 14, wherein the processing unit is further configured to generate a malfunction signal when at least one ground signal fed to the processing unit indicates the ground loss to the vehicle ground terminal connected or to be connected to a respective ground potential terminal.

\* \* \* \* \*